Figure 1:
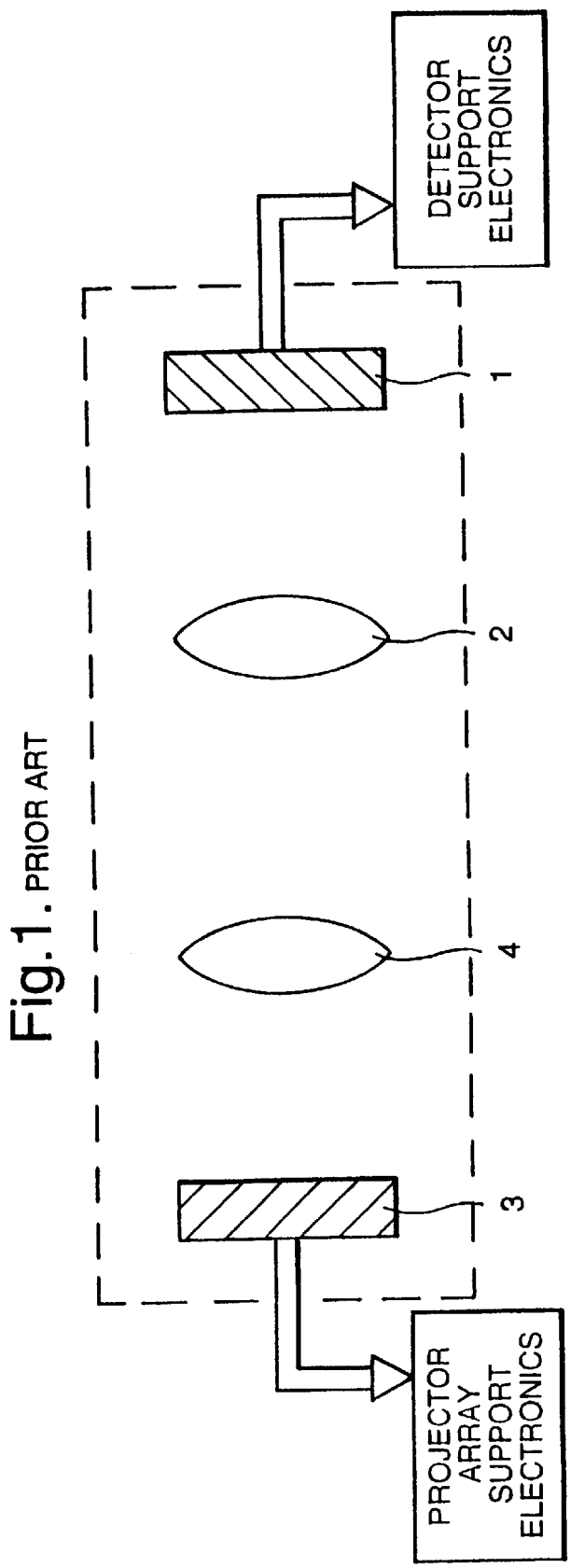

though ot US005949081A

United States Patent [19]
Ashley et al.

[11] Patent Number: 5,949,081
[45] Date of Patent: Sep. 7, 1999

[54] DYNAMIC INFRARED SCENE PROJECTOR

[75] Inventors: Timothy Ashley; Charles T Elliott; Neil T Gordon, all of Malvern, United Kingdom

[73] Assignee: The Secretary of State for Defence, Farnborough, United Kingdom

[21] Appl. No.: 09/043,792

[22] PCT Filed: Sep. 26, 1996

[86] PCT No.: PCT/GB96/02374

§ 371 Date: Mar. 27, 1998

§ 102(e) Date: Mar. 27, 1998

[87] PCT Pub. No.: WO97/13282

PCT Pub. Date: Apr. 10, 1997

[30] Foreign Application Priority Data

Sep. 29, 1995 [GB] United Kingdom .................. 9519897

[51] Int. Cl.$^6$ ........................................................ H05B 3/20
[52] U.S. Cl. .................................... 250/493.1; 250/494.1; 250/495.1; 250/504 R
[58] Field of Search ............................. 250/493.1, 494.1, 250/495.1, 504 R

[56] References Cited

U.S. PATENT DOCUMENTS 5,214,292   5/1993   Hendrick, Jr. ..................... 250/495.1
5,864,144   1/1999   Laine ................................. 250/493.1

OTHER PUBLICATIONS $7^{th}$ International Conference II–VI Compounds and Devices, Edinburgh, UK, Aug. 13–18 1995, vol. 159, No. 104, ISSN 0022–0248, Journal of Crystal Growth, Feb. 1996, Elsevier, Netherlands, pp. 1100–1103, XP002022420 Ashley T et al: "Room temperature narrow gap semiconductor diodes as sources and detectors in the 5–10 mu m wavelength region" see whole document.

Journal of Optical Technology, Oct. 1994, USA, vol. 61, No. 10, ISSN 1070–9762, pp. 711–719, WP000613694 Dmitriev I et al: "Dynamic infrared scene simulators" see p. 713, paragraph 3.2.1.

*Primary Examiner*—Kiet T. Nguyen
*Attorney, Agent, or Firm*—Nixon & Vanderhye P.C.

[57] ABSTRACT

A dynamic infrared scene projector for use infrared detections systems which has particular, although not exclusive, use in thermal imaging or seeker systems. In such systems, a dynamic infrared scene projector is used to simulate the thermal scene for testing and calibration purposes. The device comprises an array of electroluminescent semiconductor diode structures, capable of emitting both positiveand negative luminescence, and electronic circuitry for supplying currents of both polarity to each diode independently so that the emission of positive and negative luminescence can be controlled. The diode structures in the array are based on narrow bandgap semiconductor materials, for example, the $Hg_{1-x}Cd_xTe$, $In_{1-x}Al_xSb$, $Hg_{1-x}Zn_xTe$ or $In_{1-x}Tl_xSb$ materials systems (where x is the composition). In a preferred embodiment, the diodes are capable of emitting infrared radiation in the wavelength regions between 3–5 $\mu$m or 8–13 $\mu$m. By utilizing the negative luminescence properties of the diode structures, the dynamic infrared scene projector can simulate a wide range of temperatures, and in particular low temperatures, without external cryogenic cooling. The dynamic infrared scene projector also permits the use of fasterthermal imager frame rates than are achievable with existing systems.

11 Claims, 9 Drawing Sheets

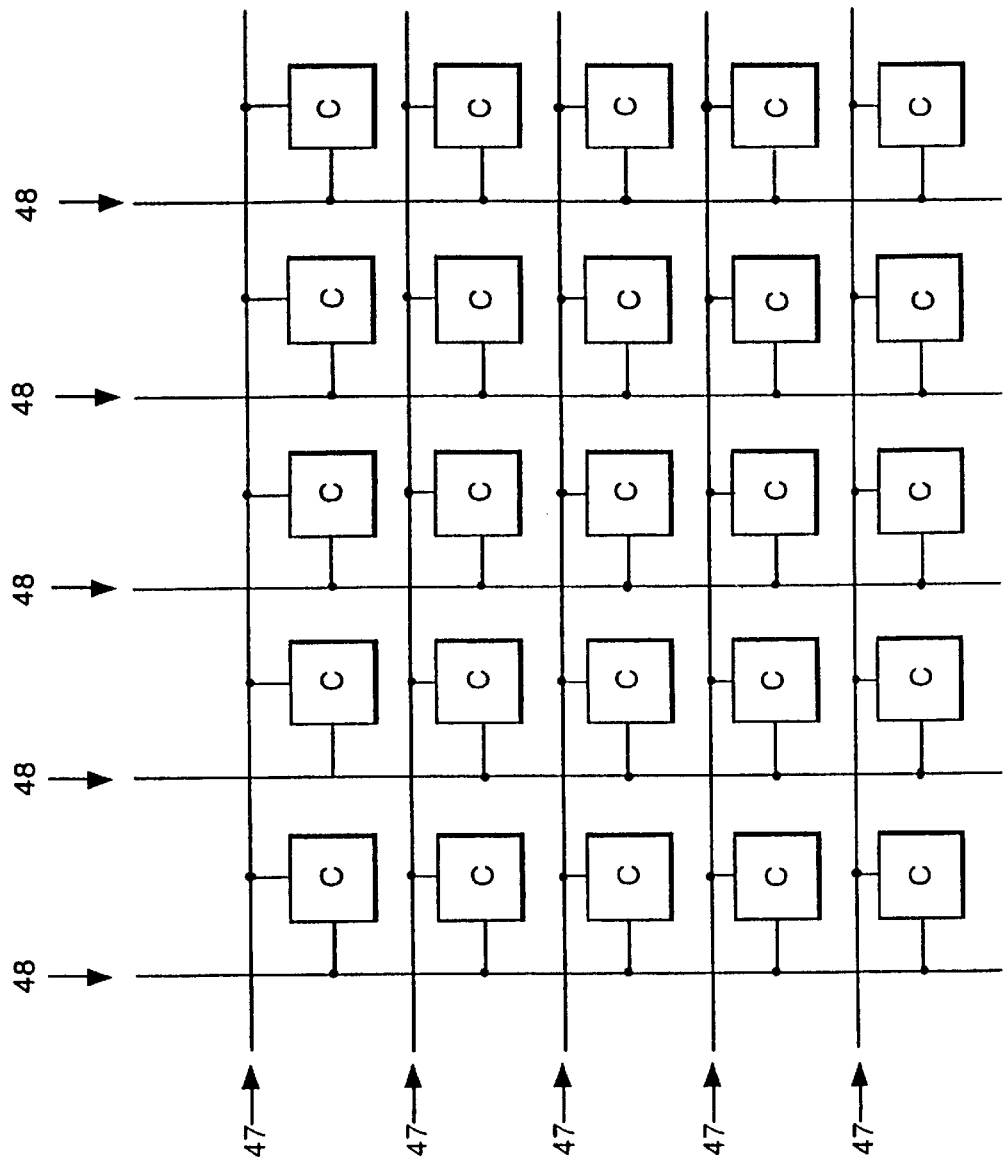

DYNAMIC INFRARED SCENE PROJECTOR

This application claims benefit of the international application under 371 of the PCT/GB96/02374 filed on Sep. 26,1996.

The present invention relates to a Dynamic Infrared Scene Projector (DIRSP) for use in testing infrared detection systems.

Infrared detection systems generally fall into the category of either thermal imaging systems, where an infrared scene is presented to an observer, or seeker systems, where the information from the focal plane is acted upon directly by a computer. Dynamic Infrared Scene Projectors DIRSP), also known as thermal picture synthesizers, are currently used for the dynamic testing of these infrared focal plane detector array systems.

It is essential that any infrared system undergoes static testing to determine performance capabilities, such as Minimum Resolvable Temperature Difference (MRTD), Noise Equivalent Temperature Difference (NETD) and spatial resolution (MTF), and to monitor any deterioration of the system in time. Such testing requires the simulation of one or more thermal scenes, typically with varying temperature differences and spatial frequencies. One existing means of performing this test makes use of a pseudo blackbody source, involving electrically heated regions or bars of differing temperature. The temperature difference between the bars may be varied so as to establish the MRTD or NETD, whilst the MTF is determined from the apparent size of the structure. Typically, the sources comprise heated bars several centimeters in size which have a low frequency response and therefore can not be used for the dynamic testing of infrared detection systems.

Dynamic testing is useful for all infrared detection systems and, in particular, for missile seeker systems, in order to test the function of the whole system, comprising infrared detector, optics, signal processing, gimbals and tracking algorithms. The requirement is to simulate, and project, a two dimensional infrared scene which can be altered at a frame rate of up to 1 kHz. Temperature ranges of up to 350° C. may typically be required.

There are no DIRSP systems currently available which meet the requirements. One class of conventional DIRSP system under development is based on two dimensional arrays of resistively heated pixels, driven by silicon integrated circuitry. However, such systems dissipate a significant and inconvenient amount of heat and the maximum frame rate achievable is approximately 100 Hz. Furthermore, real thermal scenes frequently contain objects which are very cold compared to ambient temperature, arising from the cold sky which is seen both directly by the detector and as reflections from metal objects in the scene. Resistor projector arrays are not capable of simulating such cold temperatures unless expensive and bulky cryogenic cooling equipment is employed.

U.S. Pat. No. 5,214,292 discloses a dynamic infrared scene display comprising an array of heated infrared radiation emitting elements which have an array of microlens structures coupled to the elements. Again, this display is not capable of simulating very cold temperatures without additional cooling equipment.

The present invention relates to an array of infrared light emitting diodes for use as a Dynamic Infrared Scene Projector for the testing of infrared detection systems. The device has particular use in the testing of thermal imaging systems or seeker systems. The light emitting diodes are heterostructure devices capable of negative luminescence. For example, such devices are described in U.S. Pat. No. 5,016,073. Also, infrared light emitting diodes based on the InAlSb and HgCdTe materials systems are described in T. Ashley et al., Proc. of the 7th Int. Conf. on II–VI compounds and devices, Edinburgh, UK, published Journal of Crystal Growth, vol. 159, Nos 1–4 (Feb 1996).

The invention overcomes several of the problems associated with conventional systems. For example, the power dissipation is lower, therefore reducing the need for excessive cooling, and the fundamental switching speed of the electroluminescence is such that very fast frame rates are possible. Furthermore, cold scene temperatures well below ambient can be simulated by the use of negative luminescence.

According to the present invention, a device for use as a dynamic infrared scene projector, for the testing of infrared detection systems, comprises:

an array of infrared light emitting diodes capable of emitting positive and negative luminescence and means for independently supplying to each infrared light emitting diode both positive and negative polarity currents, such that positive and negative luminescence may be emitted from each diode.

In a preferred embodiment, the diodes emit and absorb radiation in the 3–5 $\mu$m or 8–13 $\mu$m wavelength region.

In a further preferred embodiment, the diodes are based on a narrow bandgap semiconductor material.

The diodes may be based on mercury cadmium telluride ($Hg_{1-x}Cd_xTe$) materials, indium aluminium antimonide $In_{1-x}Al_xSb$) materials, mercury zinc telluride ($Hg_{1-x}Zn_xTe$) materials or indium thallium antimonide ($In_{1-x}Tl_xSb$) materials, where x is the composition.

The device may include an array of optical concentrators on the surface of said diodes.

The device may include an array of Winston cones on the surface of said diodes.

The device may include an array of lenses on the surface of said diodes.

Figure 2:
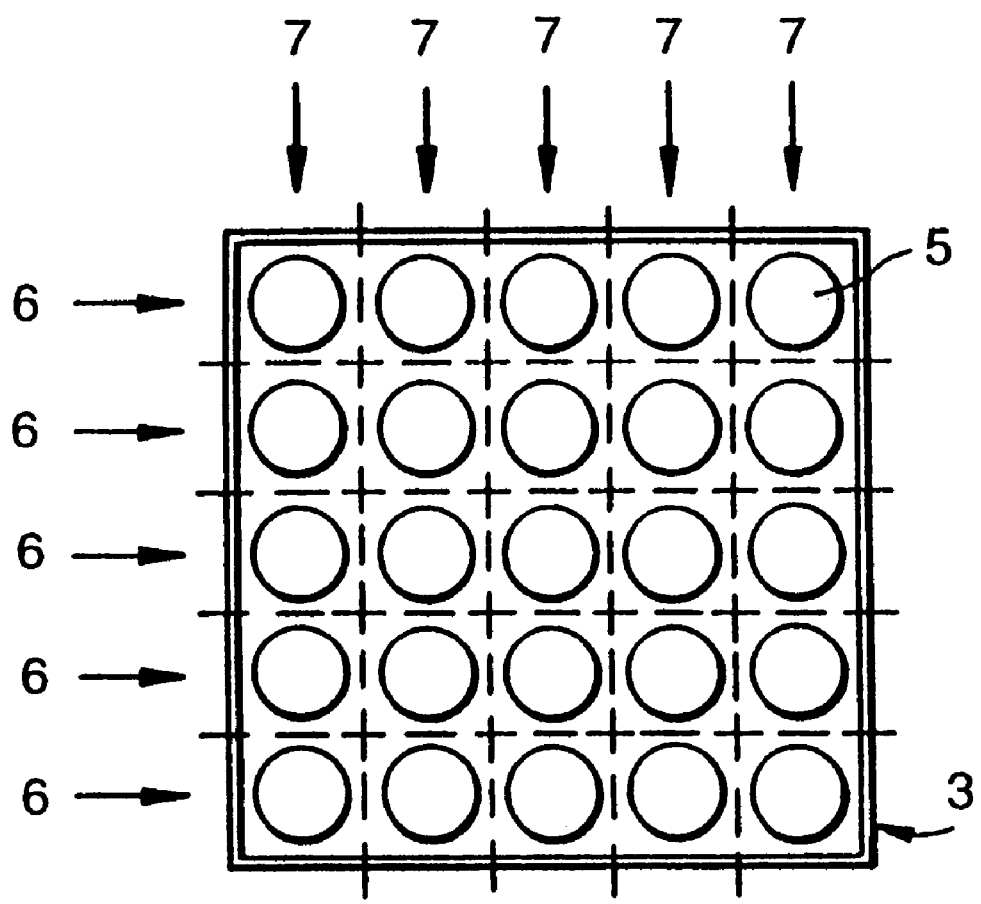

The invention will now be described, by example only, with reference to the following figures in which:

FIG. 1 shows a schematic diagram of a system for testing a basic thermal imaging system, the design of which is known in the prior art, FIG. 2 shows a schematic diagram of an array of electroluminescent diodes, as used in the present invention.

Figure 3:
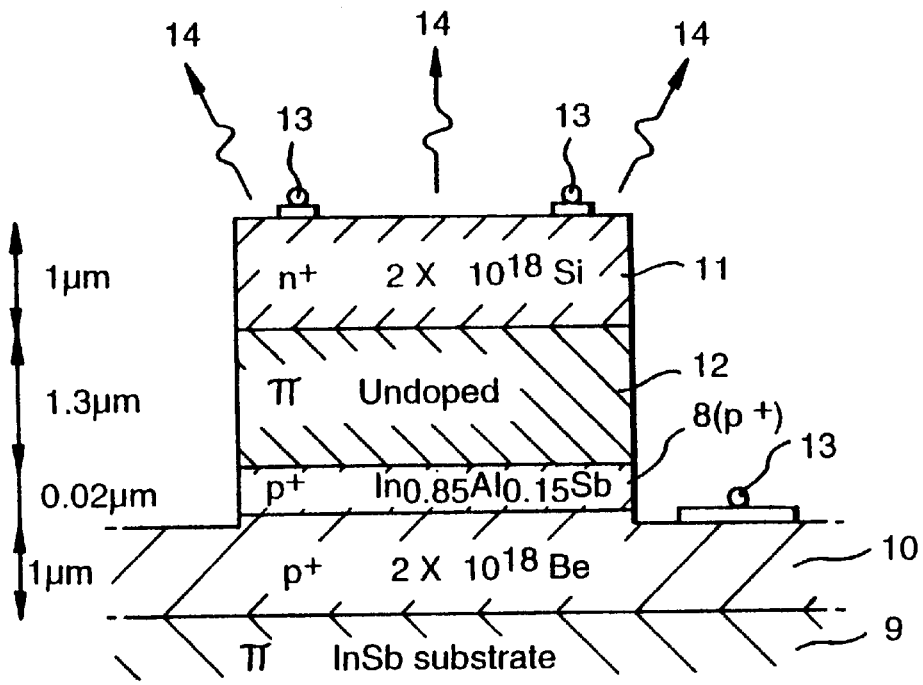
Figure 4:
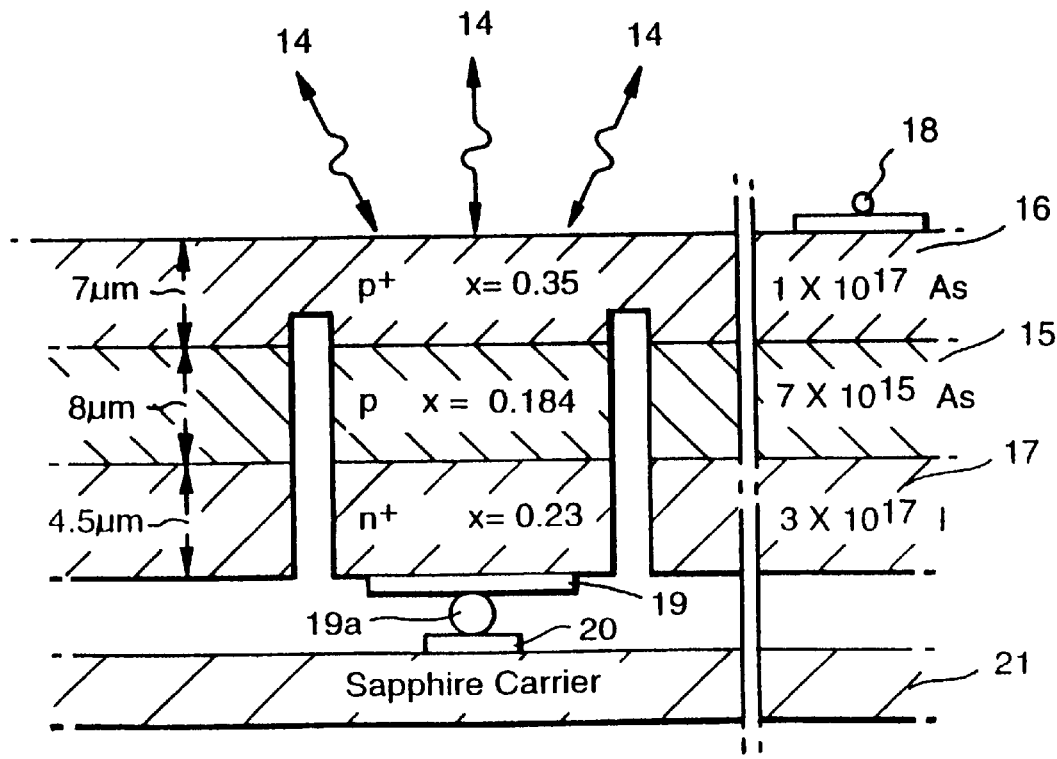
Figure 5:
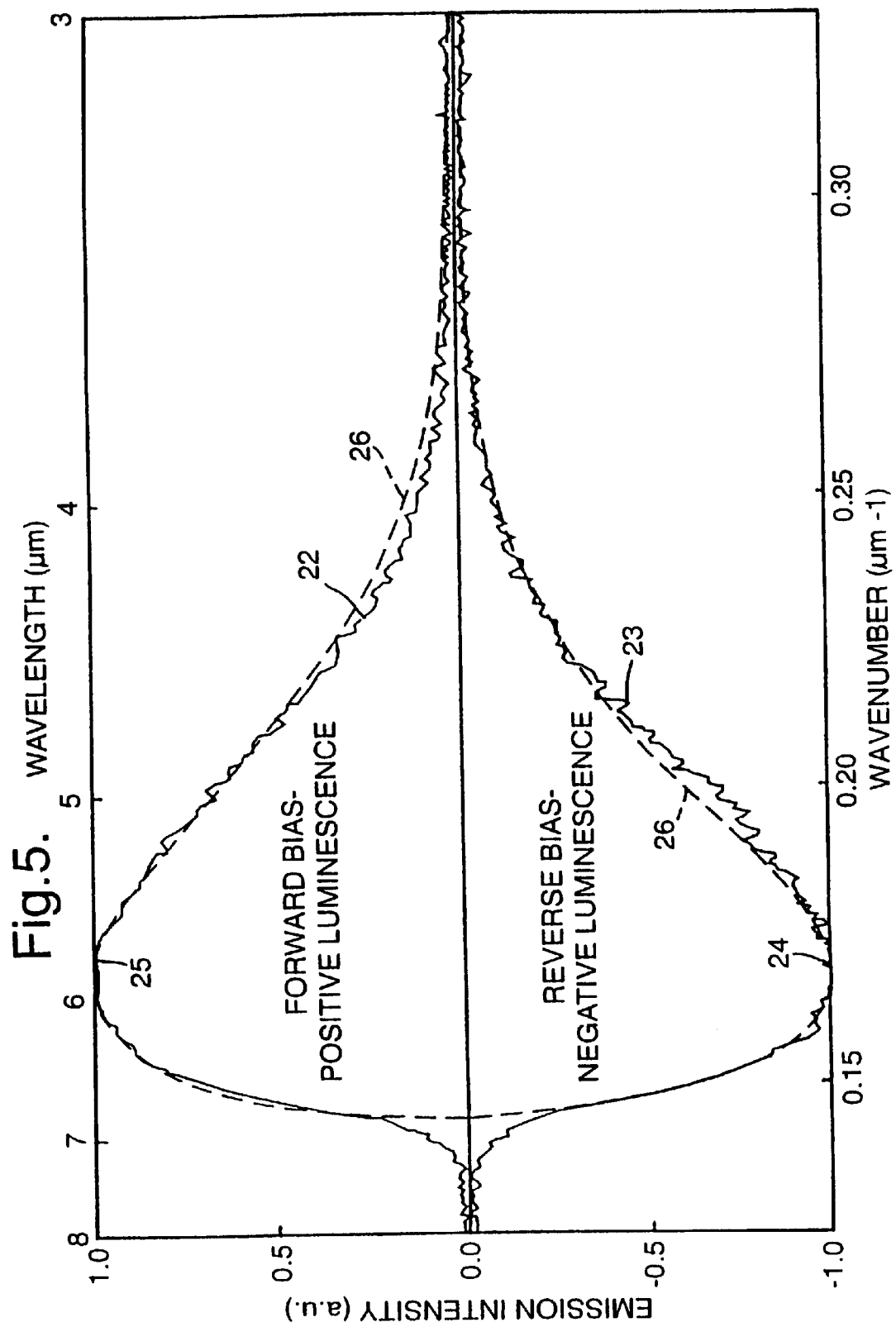
Figure 6:
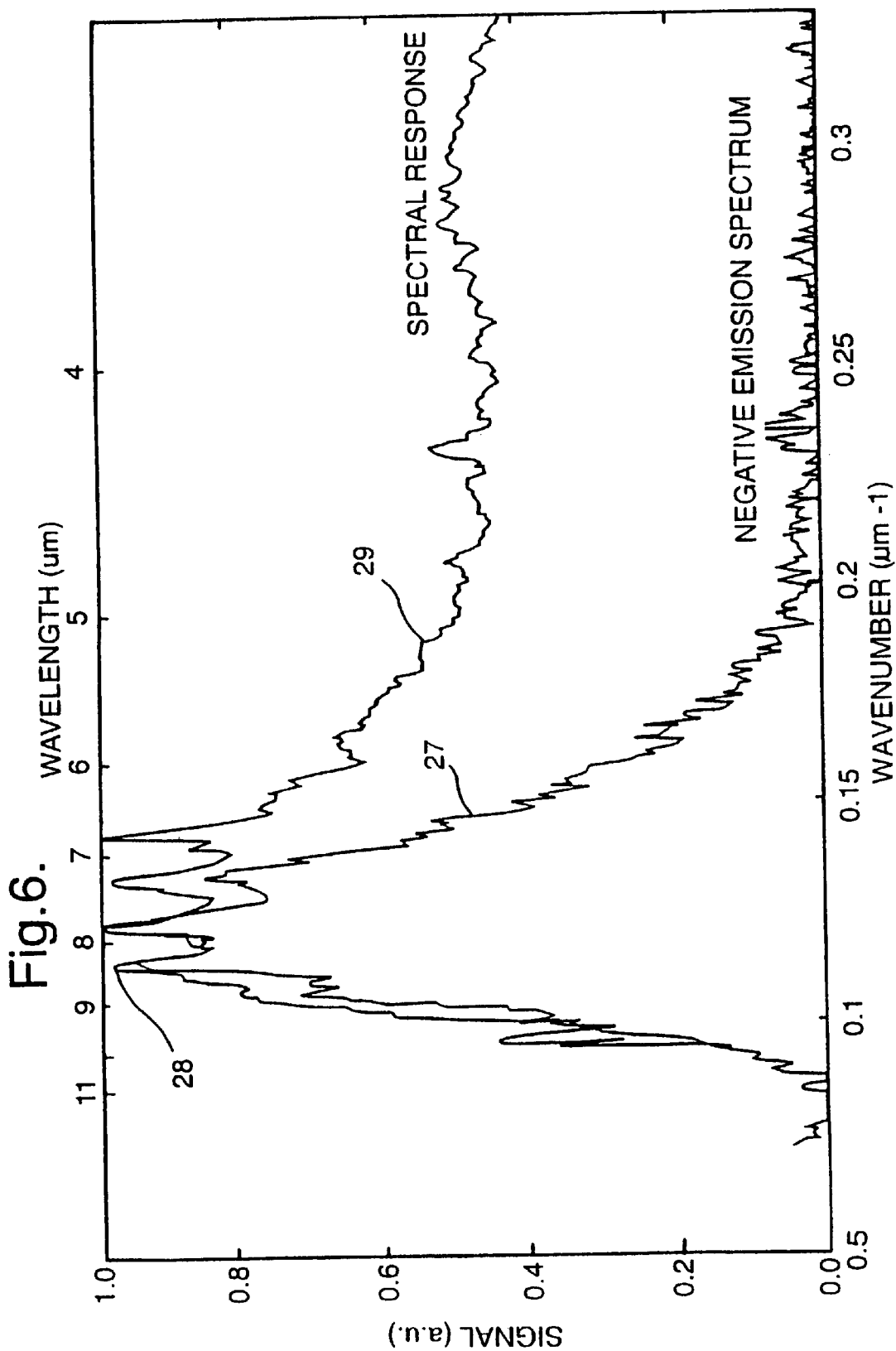
Figure 7:
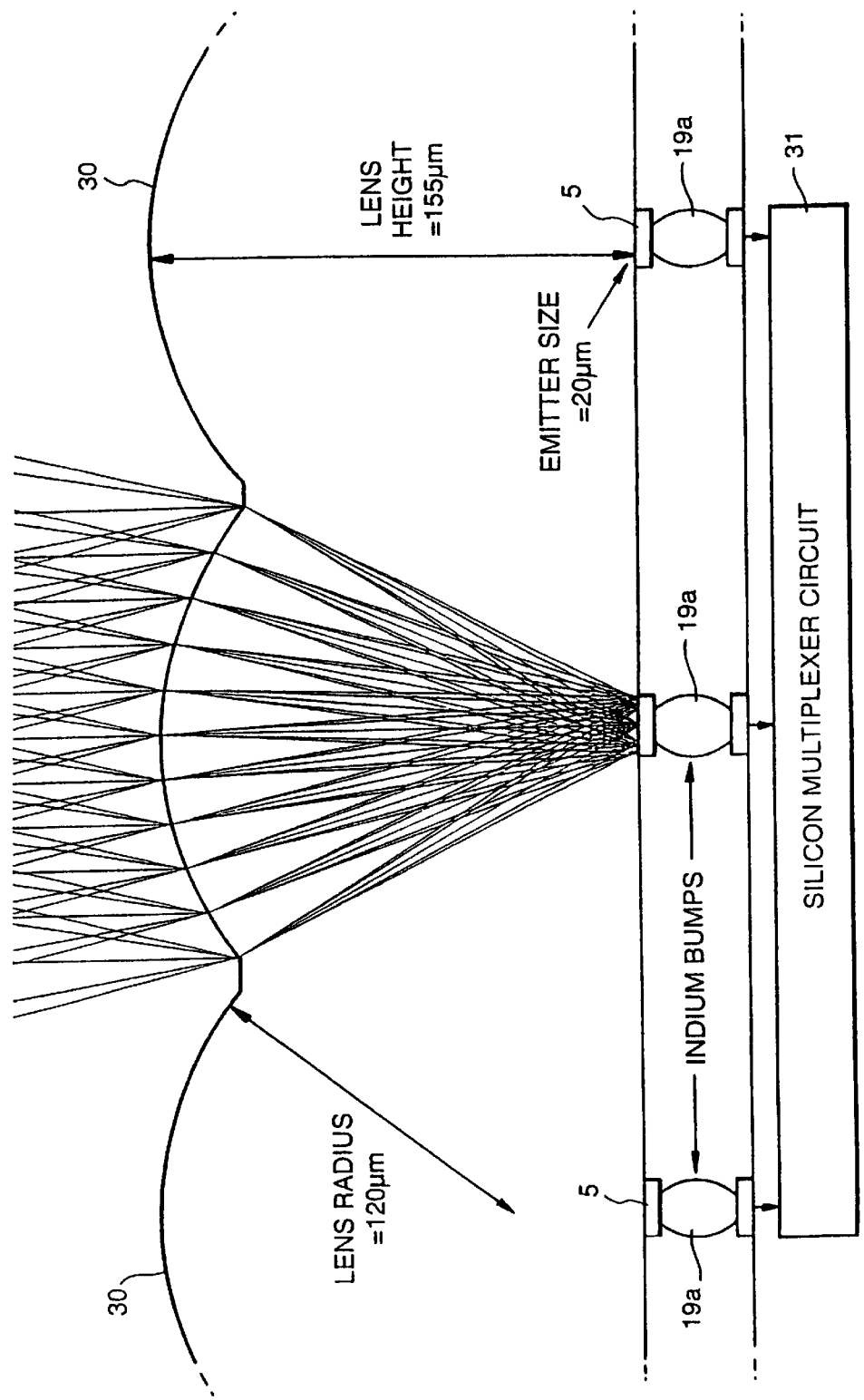
Figure 8:
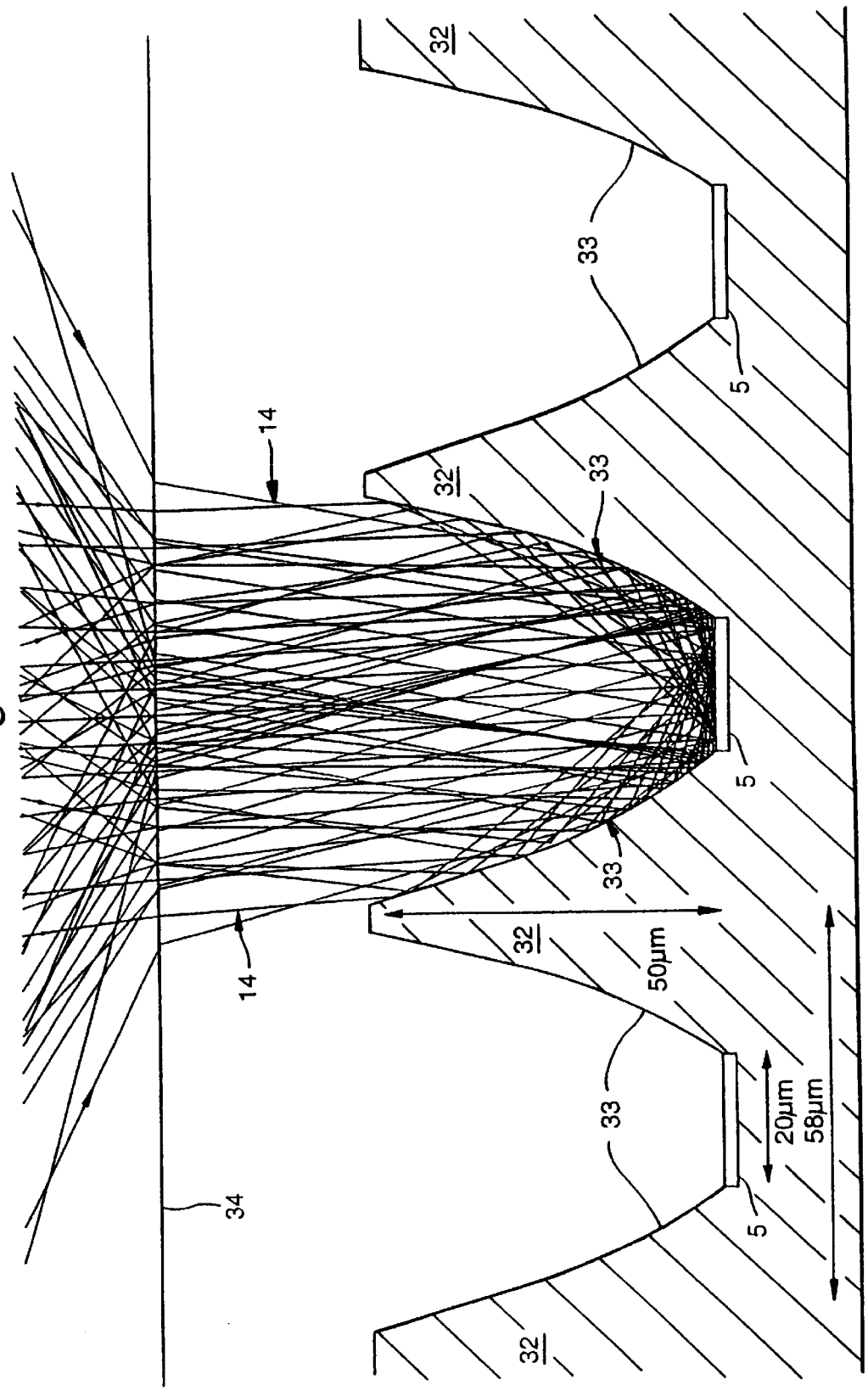
Figure 9:
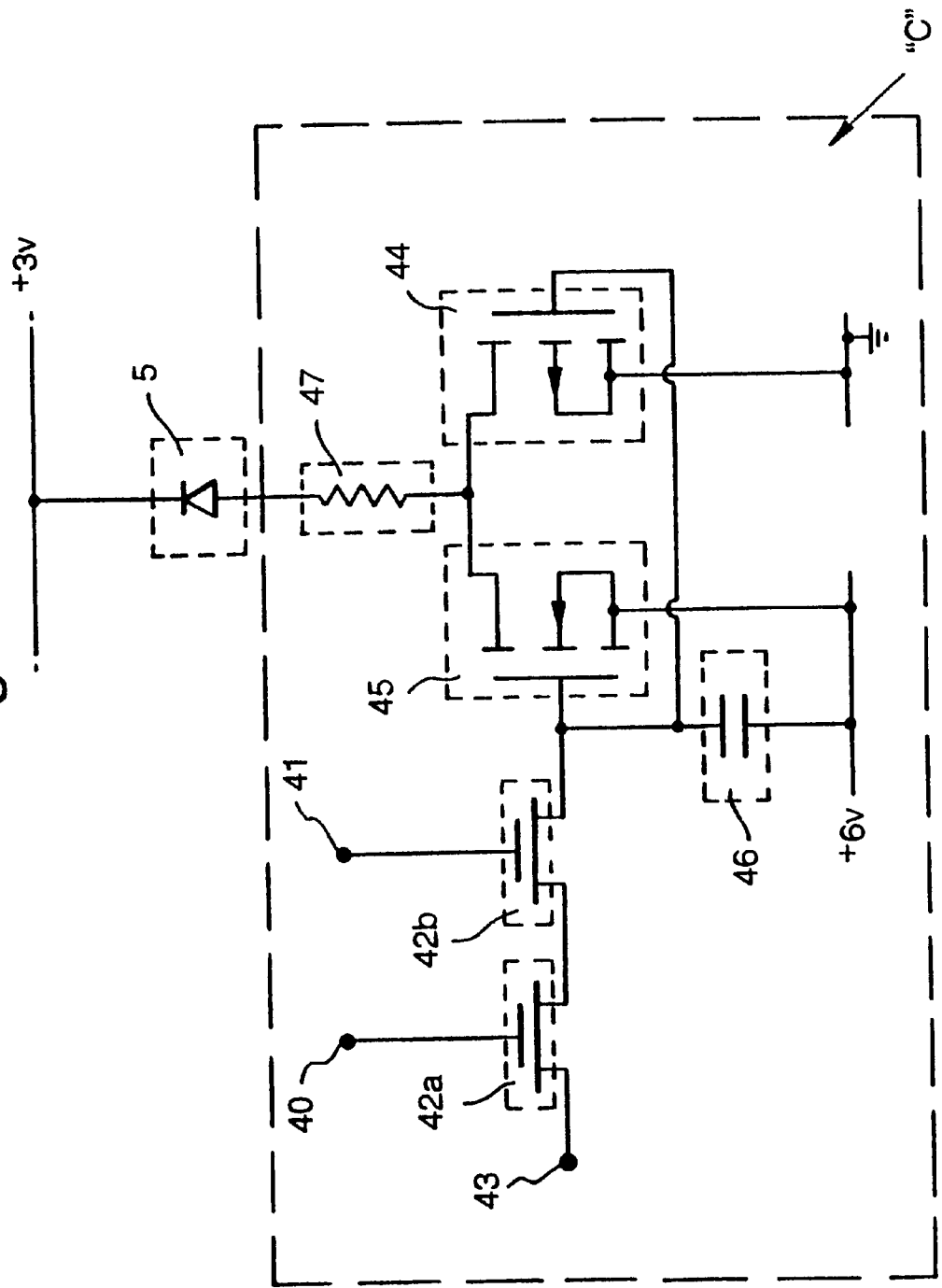

FIGS. 3 and 4 show schematic diagrams of the multilayer diode structures which may be used in the present invention, FIG. 5 shows the spectrum of emitted radiation from an InSb device under forward and reverse bias, FIG. 6 shows the negative luminescence spectrum and the spectral response for a $Hg_{1-x}Cd_xTe$ device under reverse bias, FIG. 7 shows a schematic diagram of a typical immersion optics arrangement which may be used in the device, FIG. 8 shows a schematic diagram of a typical arrangement of Winston cones which may be used as optical concentrators in the device, FIG. 9 shows an diagram of an electronic circuit which may be used to supply both positive and negative polarity currents to the diode array, and FIG. 10 shows a block diagram of the row-column addressing circuit for the diode array.

Referring to FIG. 1, a typical thermal imaging system comprises an array of infrared detectors 1 and an associated lens or lens arrangement 2. The dynamic infrared scene projector comprises a projector array 3 and an associated lens or lens arrangement 4. The control electronics for the projector array and the detector array are also shown. The array of infrared detectors 1 may, for example, be an array of resistive bolometric detectors or an array of photovoltaic detectors. In existing systems, the projector array 3 may be a two dimensional array of resistors driven by a silicon integrated system. However, such systems have several associated problems. For example, they can only operate at low frame rates (~100 Hz) and can only achieve cold temperature simulation with extensive cryogenic cooling. They also dissipate a significant and inconvenient amount of heat.

In the present invention, the projector array 3 is an array of infrared light emitting diode structures capable of emitting both positive and negative luminescence. A simple diagram of an array of luminescent diodes (also referred to as electroluminescent diodes) is shown schematically in FIG. 2. The array may comprise any number of diode elements (or pixels) 5, the optimum number depending on the number of elements in the infrared detector array under test. A five-rows (6) by five columns (7) array is shown for simplicity, although in practice the array would be much larger. Generally, the number of pixels in the projector array should be at least equal to that in the detector array under test, and ideally it would be four times that in the detector array (i.e. twice in each direction, rows-columns) in order to avoid aliasing. For example, if an infrared detection system has a 256×256 array of InSb detectors, it would preferably be operated with a 512×512 projector array.

A dynamic infrared scene projector employing electroluminescent diode structures has several advantages over existing systems employing two dimensional resistor arrays. For example, by utilizing the negative luminescence from such devices, it is possible to simulate cold temperatures without the excessive cooling required in existing systems. Such luminescent arrays also permit the use of faster image frame rates than are achievable with existing systems.

FIGS. 3 and 4 show schematic diagrams of the diode structures. $In_{1-x}Al_xSb$ and $Hg_{1-x}Cd_xTe$ respectively, where x is the composition. Initially, the array is grown epitaxially on a suitable substrate. The array is formed on the substrate using standard techniques, such as mesa etching or ion beam milling. These techniques are conventional to one skilled in the art.

Referring to FIG. 3, the device shown may be based on the InSb/ $In_{1-x}Al_xSb$ system and has a four layer $p^+$—$p^+$—$\pi$—n structure, where the $p^+$ layer 8 is of the form $In_{0.85}Al_{0.15}Sb$. The example is given for illustrative purposes only and the device may in fact have one of a number of compositions and combinations of doping levels. The structure may be grown by molecular beam epitaxy on to an InSb substrate 9, the technique of which is standard to one skilled in the art [T. Ashley et al., Semicond. Sci. Tech. 8 S386(1993)].

The purpose of the $p^+$ layer 10 is to provide a low resistance, low injection contact to the $In_{0.85}Al_{0.15}Sb$ region 8. The $n^+$ region 11 is 1 $\mu$m thick and is doped with silicon (Si) to an electrical level of $2\times10^{18}$ cm$^{-3}$. The $p^+$ (10) and $p^+$ (8) regions are doped with beryllium (Be) to a level of $2\times10^{18}$ cm$^{-3}$ and have thicknesses of 1 $\mu$m and 200 Å respectively. The composition, x, of the $In_{1-x}Al_xSb$ barrier 8 is 0.15. The central $\pi$ region 12 is 1.3 $\mu$m thick and is not deliberately doped. Circular diodes of 300 $\mu$m diameter are fabricated by means of mesa etching to the $p^+$ region 10. Sputtered chromium/gold contacts 13 are applied to the top of each mesa structure and to the $p^+$ region 10. The infrared radiation 14 emitted from the mesa structure is also indicated. The surfaces of the structure may be coated with an anti reflection coating (not shown), for example, 0.7 $\mu$m of tin oxide.

Referring to FIG. 4, the device is based on a $Hg_{1-x}Cd_xTe$ system and has a three layer $p^+$—p—$n^+$ structure. The structure may be grown by metal organic vapour phase epitaxy using the inter-diffused multilayer process on a GaAs substrate [S.J.C. Irvine et al., Materials Letters 2, 305(1984)]. This technique is conventional to one skilled in the art. In the example, the $Hg_{1-x}Cd_xTe$ device has a composition, x, of 0.184 in the active $\pi$ region 15, x=0.35 in the $p^+$ region 16 and x=0.23 in the $n^+$ region 17. The $\pi$ and $p^+$ layers are doped with arsenic to levels of $7\times10^{15}$ cm$^{-3}$ and $1\times10^{17}$ cm$^{-3}$ respectively and the $n^+$ region is doped with iodine to a level of $3\times10^{17}$ cm$^{-3}$. The diode structures are defined in a monolith of the material by etching circular trenches to produce linear arrays of the required number of elements with a common contact 18 to the $p^+$ region. The complete mesa device is then passivated with zinc sulphide approximately 0.3 $\mu$m thick (not shown), and metallised with chromium/gold. A typical mesa diameter would be 45 $\mu$m. The electrical contact 19 to the mesas may be achieved by indium bump bonding the array on to a gold lead-out pattern 20 on a sapphire carrier 21. This technique is conventional to one skilled in the art.

The wavelength range over which the thermal imaging camera operates determines the appropriate material structure for use in the luminescent diode array. Diode structures based on $Hg_{1-x}Cd_xTe$ or $In_{1-x}Al_xSb$ materials, emit infrared radiation in the 3–5 $\mu$m wavelength region. Devices based on $Hg_{1-x}Cd_xTe$ materials may also emit in the 8–13 $\mu$m wavelength region. Alternatively, the diode structures may be formed from other narrow bandgap semiconductor materials, for example $Hg_{1-x}Zn_xTe$ or $In_{1-x}Tl_xSb$.

To illustrate the phenomenon of negative luminescence, the spectra of the emitted radiation from an InSb device under both forward bias 22 and reverse bias 23 are shown in FIG. 5. The minimum in the luminescence spectrum 24 occurs at 6.0 $\mu$m whilst the peak in the positive luminescence spectrum 25 occurs at 5.8 $\mu$m. The dashed lines 26 indicate theoretical calculations for the net band to band radiative recombination.

FIG. 6 shows the negative luminescence emission spectrum 27 for a $Hg_{1-x}Cd_xTe$ device under reverse bias. A single peak 28 is seen at a wavelength of approximately 8.5 $\mu$m, with a long wavelength tail extending to beyond 10 $\mu$m. The figure also shows the spectral response of the device 29 when used as a detector (operating in reverse mode).

The relatively large arrays that are often required in infrared detection systems have comparatively high electrical currents. For example, InSb devices with the appropriate $\pi$-layer thickness for efficient negative luminescence have a reverse saturation current density in the range 15–20 A cm$^{-2}$. It is desirable to minimise this figure, whilst maintaining a high luminescence output. This can be achieved by the use of concentrators.

For example, referring to FIG. 7, lenses 30 with a radius of curvature of 120 $\mu$m are formed in degenerately doped InSb by ion beam milling. The technique of ion beam milling for this purpose is conventional to one skilled in the art. The lenses may be formed from a number of materials. For example, for devices based on an $In_{1-x}Al_xSb$ structure, the lenses are preferably formed from InSb and for devices based on a $Hg_{1-x}Cd_xTe$ structure, the lenses are preferably formed from CdTe or CdZnTe.

In this example, the diode array elements 5 (emitting regions) are 20 $\mu$m in diameter. The output radiation 14 is focused into an $f/2$ cone (where $f$ is the $f$-number) by the lenses 30. The radius of curvature of each lens is such that radiation emitted from each diode element 5 is not reflected back to the diode but is transmitted in a forward direction to the detector array under test. By keeping the area from which the radiation is emitted small, the current in the diode structure is reduced, whilst the lens arrangement ensures the negative luminescence efficiency is high (the negative luminescence efficiency is the proportion of infrared radiation impinging on the front surface of the device which is absorbed by the diode 5). The diode array is driven by means of a silicon multiplexing circuit 31, an example of which is described below.

Referring to FIG. 8, desirable efficiencies and current densities may also be achieved by using Winston cones 32. In this example, the radiation 14 emitted from a 20 μm diameter diode 5 undergoes total internal reflection at the walls of the cone 33 before eventually reaching the surface of the device 34a. This surface 34a may be the surface of an anti reflection coating 34 applied to the array of cones. The shape of the cone is designed so that the emitted radiation 14 incident upon this surface 34a is at such an angle that it is transmitted rather than reflected. Using this arrangement, the surface area of the emitting region is kept small, therefore ensuring a low current, whilst a high negative luminescence efficiency is achieved. Currents equivalent to a mean current density of around 2 A cm$^{-2}$ can be achieved with this arrangement.

For InSb devices, the cones are formed in an InSb substrate and the cone shaping is carried out by ion beam milling. Alternatively, a chemical etching may also be used to manufacture the surface in this way, the technique of which is standard to one skilled in the art.

An example of the electronic circuit which may be used to supply current to the infrared light emitting diode array is shown in FIG. 9. In order to exploit both positive and negative luminescence, it is essential that there is a means for supplying both polarities of current to each diode element or pixel 5. Either a positive or a negative current is applied to each diode 5 at any one instant, depending on whether the emission of positive or negative luminescence is required in a particular pixel. This is an essential feature of this circuit, or any other circuit used to drive the diode array.

The circuit "C" is implemented at each pixel of the silicon addressing circuit. The circuit comprises a digital row address select line 40 and a digital column address select line 41 so that each pixel may be addressed individually. Two field effect transistors (FETs) 42a and 42b are associated with each pixel 5, one for row select and one for the column select. An external analogue voltage is supplied through another input line 43 and would require 2-level metal interconnection. The analogue line supplies a voltage to a complete column one at a time, even though only one pixel is addressed at any one time.

The circuit also comprises an n-channel enhancement FET 44, a p-channel enhancement FET 45, a capacitance 46 and a resistive element 47 for current limiting purposes. In practice, this capacitance may be the gate capacitance of the FETs 44 and 45. The infrared light emitting diode 5 is also shown in relation to the addressing circuitry. The characteristics of the two FETs are well know to one skilled in the art and may be understood from the description in "Physics of Semiconductors Devices" (2nd Edition), by Sze (John Wiley and Sons, 1981).

A block diagram of the row-column addressing circuit for a simple 5×5 array (see FIG. 2) is shown in FIG. 10. The circuit "C" (see FIG. 9) is implemented at each pixel 5 of the array, with the row address lines and column address lines indicated by 47 and 48 respectively. Once each frame cycle, the row-column addressing scheme will select the first FET switch and close it to allow charge to be placed on the capacitance 46. The charge on the capacitance controls the current through the diode 5 until the next reset is initiated. When a voltage greater than a threshold is applied to the capacitance 46, the n-channel enhancement FET 44 is ON and will pass current through the diode 5 in the polarity which produces negative luminescence. When a voltage less than a threshold is applied to the capacitance 46. The n-channel enhancement mode is OFF and the p channel enhancement FET 45 is ON and will pass current through the diode 5 in the polarity which produces positive luminescence. Intermediate levels of charge on the diode permit the use of intermediate levels of luminescence, or "grey scales".

In practice, the fundamental switching speed of the electroluminescent diodes is in excess of 1 MHz. The frame rates which may be achieved with such a system are therefore determined not by the thermal time constant of each pixel but by the frequency of the multiplexer drive circuit.

We claim:

1. A device for use as a dynamic infrared scene projector, for the testing of infrared detection systems, comprising:

an array (3) of infrared light emitting diodes (5) capable of emitting positive and negative luminescence (14) and means (C) for independently supplying to each infrared light emitting diode (5) both positive and negative polarity currents, such that positive and negative luminescence (14) may be emitted from each diode (5).

2. The device of claim 1 wherein said diodes (5) emit and absorb radiation in the 3–5 μm wavelength region.

3. The device of claim 1 wherein said diodes (5) emit and absorb radiation in the 8–13 μm wavelength region.

4. The device of claim 1 wherein said diodes (5) are formed from a narrow bandgap semiconductor material.

5. The device of claim 4 wherein said diodes (5) are based on the mercury cadmium telluride ($Hg_{1-x}Cd_xTe$) materials system.

6. The device of claim 4 wherein said diodes (5) are based on the indium aluminium antimonide ($In_{1-x}Al_xSb$) materials system.

7. The device of claim 4 wherein said diodes (5) are based on the mercury zinc telluride ($Hg_{1-x}Zn_xTe$) materials system.

8. The device of claim 4 wherein said diodes (5) are based on the indium thallium antimonide ($In_{1-x}Tl_xSb$) materials system.

9. The device of claim 1, and including an array of optical concentrators on the surface of said diodes (5).

10. The device of claim 9 wherein said optical concentrators are Winston cones (32).

11. The device of claim 9 wherein said optical concentrators are an array of lenses (30).

* * * * *